United States Patent [19]

Killoway et al.

[11] Patent Number: 4,688,261

[45] Date of Patent: Aug. 18, 1987

[54] FREQUENCY SYNTHESIZED MULTICHANNEL RADIO APPARATUS

[75] Inventors: James M. Killoway; David J. Stubbings, both of Cambridge, England; Geoffrey S. Sparks, Geldrop, Netherlands

[73] Assignee: U.S. Philips Corporation, New York, N.Y.

[21] Appl. No.: 707,640

[22] Filed: Mar. 4, 1985

[30] Foreign Application Priority Data

Mar. 2, 1984 [GB] United Kingdom ................. 8405490

[51] Int. Cl.$^4$ ........................ H04B 1/40; H04B 11/16; H04B 1/06
[52] U.S. Cl. ..................................... 455/76; 455/151; 455/186; 455/345
[58] Field of Search ...................... 455/76, 77, 89, 349, 455/345, 151, 186, 180; 179/2 EB

[56] References Cited

U.S. PATENT DOCUMENTS

| | | | |
|---|---|---|---|
| 3,940,702 | 2/1976 | Yoshimura et al. | 455/180 |
| 4,147,984 | 4/1979 | Caudel et al. | 455/77 |
| 4,254,504 | 3/1981 | Lewis et al. | 455/77 |
| 4,267,597 | 5/1981 | Volpi et al. | 455/76 |
| 4,503,513 | 3/1985 | Pogue, Jr. | 455/77 |

*Primary Examiner*—Robert L. Griffin
*Assistant Examiner*—Curtis Kuntz
*Attorney, Agent, or Firm*—Thomas A. Briody; Jack Oisher; William J. Streeter

[57] ABSTRACT

A frequency synthesized multichannel radio apparatus comprising a synthesized tranceiver and a remotely mountable control unit. All the possible channel frequencies available to users in a large geographical area are stored in a PROM mounted in the transceiver said PROM serving as a look-up table. The addresses of those channel frequencies in the PROM which are available to a particular user are stored in an electrically alterable storage means, such as an EAROM or a E$^2$-PROM, contained in the control unit. In normal operation a channel selector in the control unit selects a particular channel in the electrically alterable storage means which in turn reads-out addresses of predetermined locations in the PROM which supplies data for example synthesizer divide numbers to the frequency synthesizer. If the channel frequencies available to a user have to be changed then with the apparatus remaining in situ a data transfer unit which has been pre-programmed with the addresses of the new channel frequencies is connected to the electrically alterable storage means and the new sequence of channel frequency addresses is stored therein.

8 Claims, 5 Drawing Figures

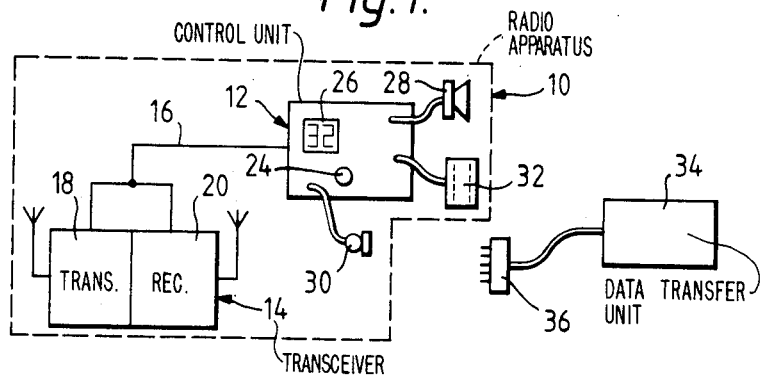
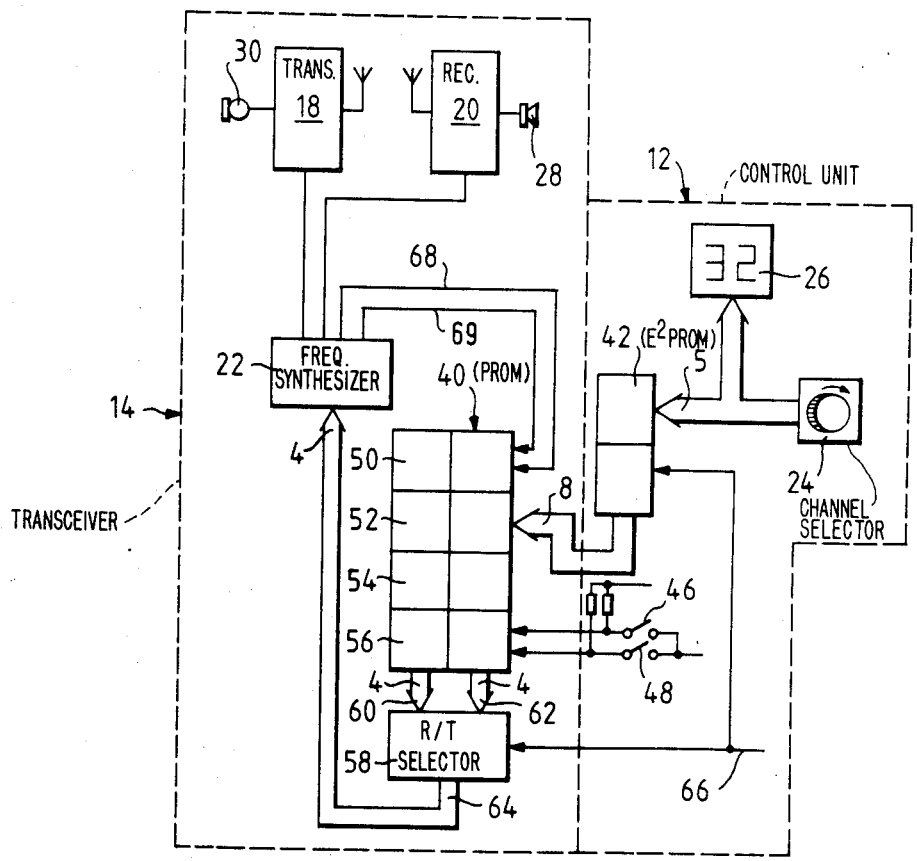

FREQUENCY SYNTHESIZED MULTICHANNEL RADIO APPARATUS

BACKGROUND OF THE INVENTION

1. Field of the Invention

The present invention relates to a frequency synthesised multichannel radio apparatus.

2. Field of the Invention

A frequency synthesised multichannel radio apparatus is known in which data to be supplied to the synthesiser to the apparatus is stored in a programmable storage means (PSM) such as a programmable read only memory (PROM) mounted in a transceiver. Data to be read-out of the PSM is selected in response to the PSM being suitably addressed by means of a manually operable channel selector in a remotely mounted control unit directly supplying the selected address to the PSM. The allocation of receiver and transmitter frequencies to any channel is fixed for the PSM, these frequencies being paired for each channel.

A drawback to such an arrangement is that if it is desired to change the allocation of frequencies to channels then it is necessary, in the case of a PROM, to remove the PROM from the transceiver and replace it with a PROM which has been programmed/reprogrammed with the new allocation of frequencies to the channels. This type of operation can be costly as well as time consuming especially when setting-up a national radio system formed by a plurality of regions some of which overlap so that the radio apparatus in one region must be capable of receiving from, and transmitting to, apparatus in an adjoining region.

SUMMARY OF THE INVENTION

According to the present invention there is provided a multichannel radio apparatus comprising a transceiver including a frequency synthesiser and a remotely mountable control unit coupled to the transceiver, characterised in that said transceiver comprises programmable storage means for storing predetermined channel frequency information and in that the control unit includes means for selecting any one of a plurality of channels and an electrically alterable storage means, said electrically alterable storage means storing preselected addresses of locations in the programmable storage means which preselected addresses relate to said predetermined plurality of channels, whereby the stored channel frequencies of said preselected addresses can be altered electrically without replacing the programmable storage means.

The electrically alterable storage means may comprise an electrically alterable read only memory (EAROM) or an electrically erasable PROM frequently referred to as an E²PROM. By providing an electrically alterable storage means in the control unit reprogramming of the addresses of those frequencies which are available can be done using an external data transfer unit which avoids having to open the transceiver to exchange PROMs or the like. This means that for a national radio network having a plurality of regions each with dedicated channels which differ from region to region, a standard radio apparatus can be constructed with the PROM in the transceiver storing all the possible channel frequencies available in any of the regions and the electrically alterable storage means programmed by a suitable pre-programmed data transfer unit to store the addresses of those channels which are available to a user in a particular region. In the case of installed equipment, such as mobile radio apparatus, a technician with a data transfer unit can move quickly from apparatus to apparatus re-programming the electrically alterable storage means using a data transfer unit which re-programming operation only lasts for a matter of seconds.

The control unit may have a connector by which the data transfer unit can be coupled to it. In order to prevent the operation of the transceiver when the re-programming of the electrically alterable storage means is taking place, inhibit means may be provided to de-energise the transceiver.

The data transfer unit when connected to the control unit may derive its power from a power supply in the control unit. If the storage device in the data transfer unit is of a non-volatile type then it is unnecessary for a power supply unit to be provided thus making the data transfer unit lighter and more compact which is desirable if it is to be portable and used in confined areas.

The control unit may comprise means to prevent spurious signals from being produced when the data transfer unit is disconnected and also to prevent large r.f. signals from causing malfunction of the control unit.

BRIEF DESCRIPTION OF THE DRAWINGS

The present invention will now be described, by way of example, with reference to the accompanying drawings, wherein:

FIG. 1 is a block diagram of an embodiment of the present invention,

FIG. 2 illustrates diagrammatically, and in greater detail than in FIG. 1, details of the control unit and the transceiving apparatus.

In the drawings the same reference numerals have been used to indicate corresponding parts.

DESCRIPTION OF THE PREFERRED EMBODIMENTS

Figure 3:
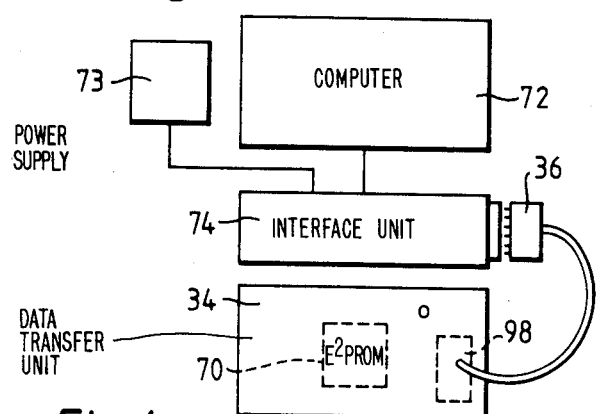
FIG. 3 is a block schematic diagram of an arrangement for programming the data transfer unit using a computer.

FIG. 1 illustrates an embodiment of the invention as may be used in a vehicle wherein the radio apparatus 10 comprises a control unit 12 which may be mounted in the dashboard area of the vehicle and a transceiver 14 which is mounted elsewhere such as in the vehicle boot. The control unit 12 is connected by a cable 16 to the transmitter 18 and receiver 20 sections of the transceiver 14. The master oscillator frequency of the transmitter 18 and the local oscillator frequency of the receiver 20 are derived from a frequency synthesiser 22 (FIG. 2) located in the transceiver 14. The control unit 12 includes a multiposition, for example 40 position, channel selector 24, which may comprise mechanical switches combined with appropriate electronic means, and a channel number indicator 26. A loudspeaker 28 and a microphone 30 are connected via respective flexible leads to the control unit 12. A socket 32, in this case a twenty-five way one, is also connected to the control unit 12 via a flexible lead.

A data transfer unit 34 for programming or re-programming the frequencies of the channels available to a user has a flexible lead with a twenty-five way plug 36 on it, which plug 36 complements the socket 32.

The radio apparatus shown in greater detail in FIG. 2 comprises a PROM 40 located in the transceiver, which PROM 40 supplies data to the frequency synthesiser 22. An electrically alterable storage means 42, for example an EAROM or E$^2$PROM, located in the control unit 12 stores the addresses of those locations in the PROM 40 whose channel frequencies are available to the user. The number of storage locations in the storage means 42 is generally fewer than in the PROM 40. Selection of a channel is done using the multiposition channel selector 24, the precise number of available operational channels being determined by the programming of the storage means 42. When the data transfer unit 34 is connected to the storage means 42 via the socket 32 and the plug 36, firstly any address information stored is erased and secondly a new set of addresses relating to storage locations in the PROM 40 are stored.

In a particular example of the radio apparatus the PROM 40 comprises four separate pages 50, 52, 54 and 56 each corresponding to a different operating mode of the radio apparatus; for example: two frequency simplex operation, reverse two frequency simplex operation, single frequency simplex operation and experimental/special purpose operation, respectively. Each of the pages represents a look-up table of synthesiser data, more particularly the synthesiser divide numbers (SDN's), each of which relates to a frequency at the output of the synthesiser 22. In operation a particular page is selected by actuation of mode switches 46, 48. If we consider page 50 for example, which relates to two frequency simplex operation, then the transmitter frequencies lie in the range 143 to 148 MHz and the receiver frequencies in the range 152 to 156 MHz. To be able to operate in the different modes the equipment has to be capable of operating in the overall bandwidth of 143 MHz to 156 MHz for transmitting and receiving. Each channel is separated by 12.5 kHz. The transmit and receive frequencies are paired so for any one transmit frequency then there is a pre-designated receive frequency. Thus when the channel selector 24 selects a channel in this mode it automatically selects two frequencies. By way of convenience each page 50 to 56 has eight bits of storage for each address and these are arranged as 4 bits (=1 byte) for receiver data and 4 bits (=1 byte) for transmitter data. Now as one SDN requires 4 bytes then the SDN is made-up by reading-in to a storage means of the synthesiser 22 one byte at a time. These four bytes are stored in four successive locations in the PROM 40. Consequently it follows from this that the number of frequencies stored by the PROM 40 is a quarter of the number of available addresses. In operation the storage means 42 provides the first of these four addresses in response to a channel being selected by the channel selector 24. The frequency synthesiser 22 scans this and the next three memory locations in the PROM 40 to recover the 16 data bits which are required by the frequency synthesiser 22 to provide the correct output frequency, the scanning being done by lines 68 and 69 in the frequency synthesiser 22.

In order to select which of the two bytes at each address in the PROM 40 should be used at any one time a receiver/transmitter selector device 58 is coupled to the PROM 40. The device 58 has inputs 60, 62 connected to receive the 4 receiver data bits and 4 transmitter 4 data bits, respectively, from the PROM 40, and an output 64 for supplying the selected 4 bits in parallel to the frequency synthesiser 22. A control line 66 is connected to the selector device 58 and to the storage means 42. The control line 66 is derived from a transmit switch on the microphone 30 (FIG. 1). Consequently, the selector device 58 when in the stand-by/receive mode passes on the data which is used to set up the local oscillator frequency of the selected channel. However in response to operation of the transmit switch then a signal change is applied to the selector device 58 by way of the control line 66 and the selector device 58 changes over to pass-on the data on the input 62 to the frequency synthesiser 22 which provides the master oscillator frequency to the transmitter 18.

The data in the PROM 40 is generated by a computer program. The program takes each customer's frequencies and converts each one into a respective SDN. A data file is built-up in the computer to store the SDNs. This file is then down-loaded into the PROM 40 when it is being programmed. As mentioned above there are two SDNs per channel. Thereafter the PROM 40 is placed in the transceiver 14.

The frequency synthesiser 22 comprises a vari-cap tuned voltage controlled oscillator. By the use of a particular vari-cap diode and the design of the R.F. front end it has been possible to obtain a 9% bandwidth on the receiver front-end and in consequence the whole receiver is tunable over the entire range of 143 to 156 MHz, whilst maintaining a narrow band front end to eliminate interference from transmissions in other adjacent, non-selected channels.

Reverting to the general operation of the radio apparatus 10 and the data transfer unit 34. The data transfer unit 34 is switched-on by inserting the plug 36 into the socket 32 and switching-off the control unit. The transmitter and receiver sections 18, 20- are then de-energised and power is supplied to the data transfer unit 34. Thus it is impossible for the transmitter section 18 to be transmitting and wandering over the channels when reprogramming of the storage means 42 is taking place. Once a programming switch on the data transfer unit 34 is actuated then the original contents of the storage means 42 are erased and the new contents stored location by location. This operation takes about 1 second to complete. In the interests of simplicity in circuit design and operation it has been found that the erase and write sequence for the entire storage means 42 is better than trying to effect changes by selecting a predetermined storage location, erasing its contents and writing-in new information.

Referring now to FIG. 3, the data transfer unit 34 also contains an electrically alterable storage means 70, such as an EAROM or E$^2$PROM, which contains the necessary information to be written into the storage means 42 of the control unit 12 (FIG. 2). However the storage means 70 in the unit 34 has itself to be pre-programmed and this can be done using a suitably programmed computer 72. The output of the computer 72 is connected to an interface unit 74 which has a socket into which the plug 36 is inserted during programming or reprogramming of the storage means 70. A separate power supply source 73 is connected to the interface unit 74 to energise the data transfer unit 34 when being programmed or reprogrammed.

In programming the E$^2$PROM 70 in the data transfer unit 34 using the computer 72, a channel file is loaded into the computer 72 and then down-loaded into the data transfer unit 34.

When initially building-up the channel file a user has to call-up the appropriate frequency PROM file—the user then selects which page in the PROM 40 is going to be used; that is page 50,52,54 or 56. The name of the frequency PROM file and the number of the PROM page are stored in a channel PROM for future reference. Prior to editing, the whole channel PROM file is displayed on the computer terminal. This shows the receiver and transmitter frequencies for each channel number. During editing for each channel number the computer goes to the channel PROM file, obtains the locations in the frequency PROM file of the two SDN's for that channel. It then goes to the locations in the frequency PROM file, retrieves the SDN's, calculates the frequencies related to the SDN's and displays the frequencies. When the user enters the number of the channel to be edited, that channel is shown in reverse video. The desired new receiver or transmitter frequency is then entered into the computer and is converted into a SDN, the frequency PROM file is then searched to see if the SDN is available, in other words a check is made to see if the SDN corresponds to a valid frequency. If the search of the frequency PROM file is successful the location of the matching SDN is put into the channel PROM file and the new frequency is displayed by the computer. If the search is unsuccessful the channel PROM file and the display are unaltered and the user has to try again. Once the channel PROM file is complete it is ready to be down loaded into the E$^2$PROM 70 of the data transfer unit 34.

Figure 4:
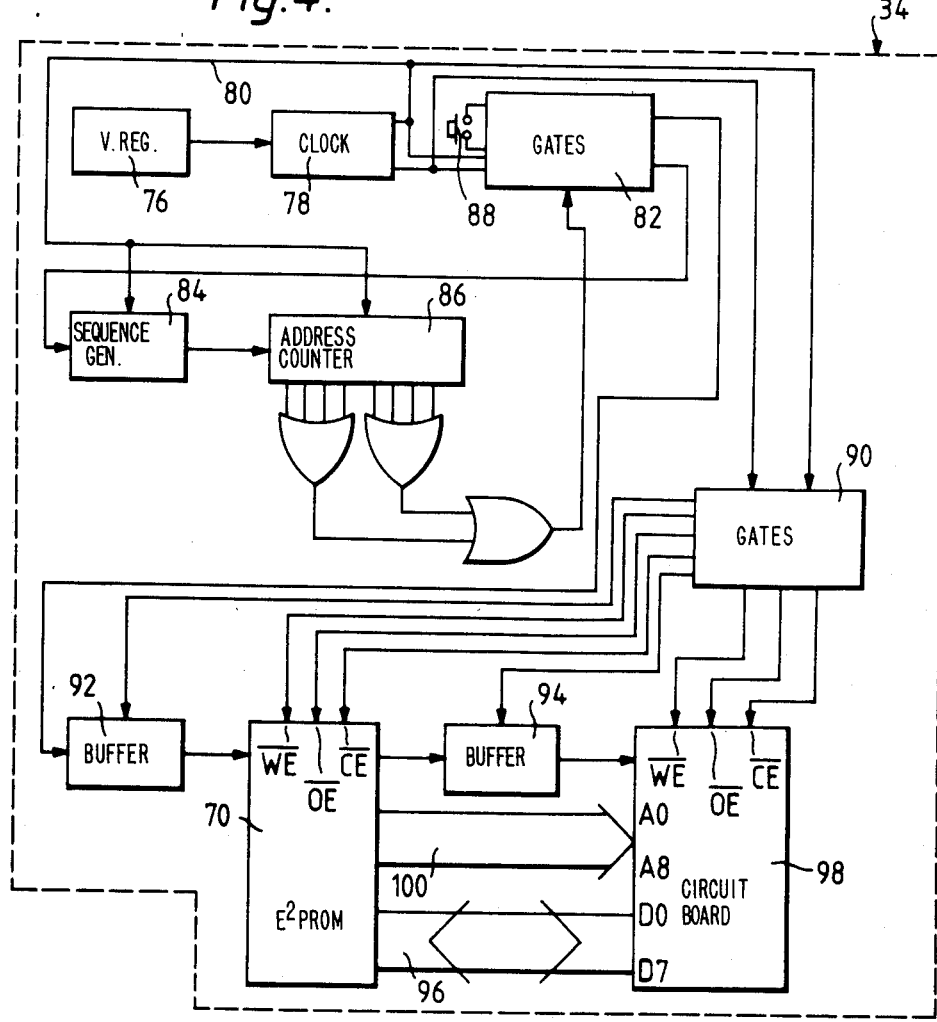
FIG. 4 is a block schematic circuit diagram of an embodiment of a data transfer unit.

FIG. 4 is a block schematic circuit diagram of the data transfer unit 34. The circuit comprises a voltage regulator 76 which produces the necessary voltage rails required within the unit 34 from a primary source located in the radio apparatus 10 or from the source 73 via the inteface unit 74. A clock oscillator 78 is provided which generates a master clock signal which is used amongst other things to provide control signals and a reset signal on a line 80. The master clock signal is supplied to a plurality of gates 82 which provide gated clock signals.

When the programming switch 88 is pressed one of the gated clock signals is supplied to a sequence generator and counter 84 which also receives the reset signal on the line 80. The sequence generator and counter 84 ensure that in the programming of the storage means 70 or the reprogramming/programming of the storage means 42 in the control unit 12 the sequence takes the full number of steps contained by the counter. The "overflow" output of the counter 84 is supplied to increment an address counter 86. This counter will the move from address 0 to address 1 and repeat the necessary operations, namely fetch new data and write this into the current address (thereby simultaneously erasing previous data in that address). The next output from the counter 84 will increment the address counter 86 which moves onto address 2. The cycle is repeated until the final address, say address 511, is reached. The programming sequence then stops and can only be restarted by actuating the switch 88 associated with the gates 82. The fact that the 511th address has been reached is determined by logically combining the eight outputs of the counter 86 using OR gates as shown.

Control signals for the storage means 70 are derived from gating circuits collectively referenced 90 which receive the master clock as well as the reset signals. These control signals ensure for example that the reading from the storage means 70 and writing into the storage means 42 (FIG. 2) takes place in the correct sequence. Such a sequence comprises switch-on, setting an address in the storage means 42 and 70 simultaneously, read-out the required data from the storage means 70, write-in that data into the storage means 42, inhibit both storage means 42 and 70, increment the address and repeat the cycle.

Buffers (including latches) 92, 94 are provided in order to permit the data transfer unit 34 to be programmed by the computer 72 (FIG. 3) or permit the data transfer unit 34 to programme the radio apparatus. This is necessary because data is fed to, or supplied from, the storage means by means of a bidirectional 8-way data bus 96 which is connected to a circuit board 98 to which the flexible lead with the plug 36 is connected. One way of indicating to the data transfer unit 34 that it is connected to the computer 72 or to the radio apparatus is to allocate one pin of the circuit board 98 say to carry a signal when it is coupled to the computer 72 but not carry a signal when it is coupled to the radio apparatus 10. An address bus 100 interconnects certain pins of the circuit board 98 to the storage means 70. Additionally control lines $\overline{WE}$, write enable, $\overline{OE}$, output enable and $\overline{CE}$, chip enable are connected to respective pins of the circuit board 98 as to terminals of the storage means 70.

In implementing the data transfer unit 34 the electrically alterable storage means 70 comprised an E$^2$PROM type X 2804-A or a type 2816A, the sequence generator and counter 84 was based on three type 4029 integrated circuits, the address counter 86 was based on a type 4040 integrated circuit, and the buffers 92, 94 were based on integrated circuits types 4053 and 40097.

Figure 5:
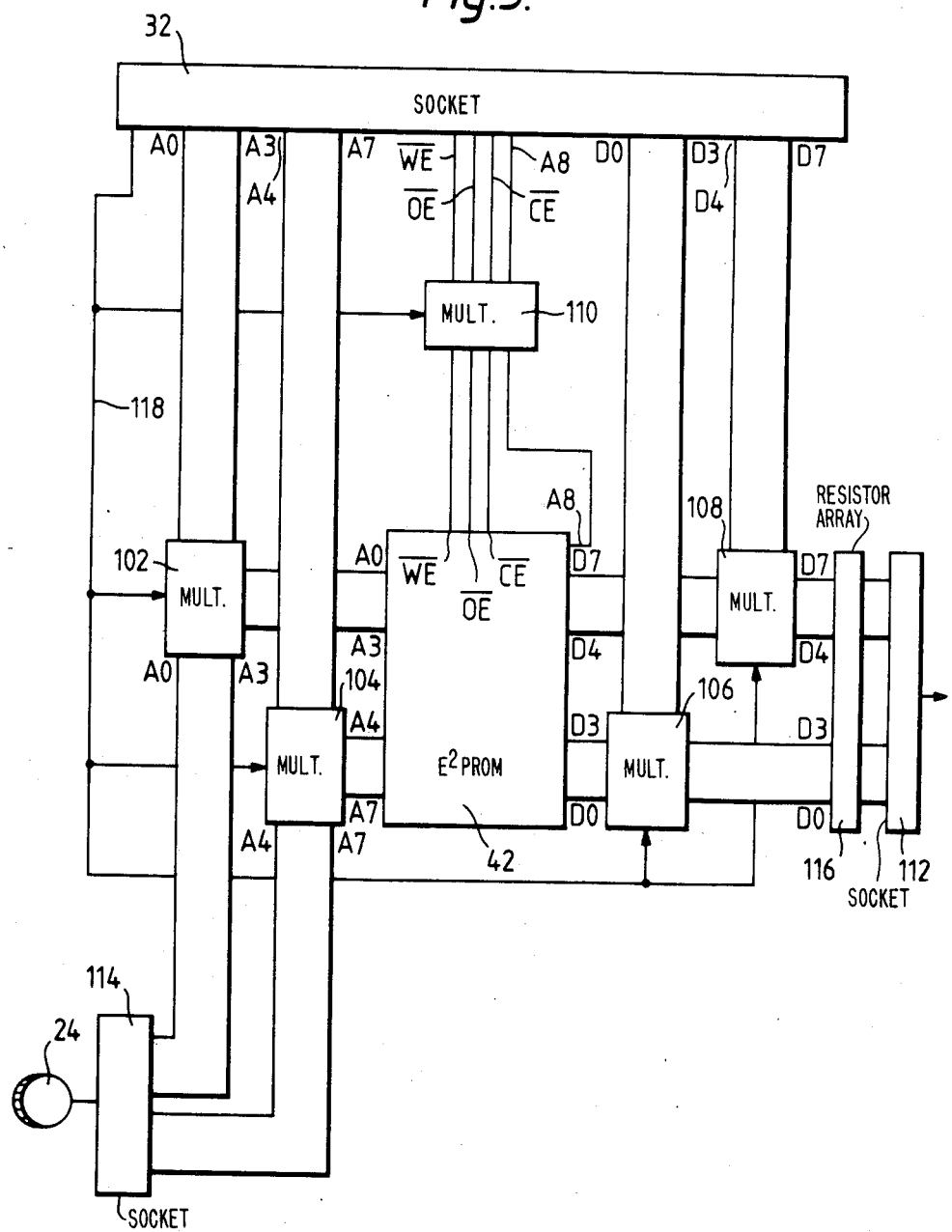
FIG. 5 is a block schematic diagram of those parts of the control unit which are concerned with the programming and selection of channels.

Turning now to the control unit 12, FIG. 5 illustrates those parts which are involved with programming the storage means 42 and with channel selection. In the interests of brevity the transceiver 14 will be described in detail as it is conventional.

In FIG. 5 the storage means 42 comprises an E$^2$PROM type X 2804-A device, terminals of which are coupled via multiplexers 102, 104, 106, 108 and 110 of type 4551 to the socket 32, to a socket 112 which is connected to the PROM 40 and to a socket 114 which is connected to the channel selector 24. Address terminals A0 to A7 of the storage means 42 are split into two groups A0 to A3 and A4 to A7 which are connected to the multiplexers 102, 104. The multiplexers 102, 104 have address terminals A0 to A3 and A4 to A7 which are coupled to respective pins of the socket 32 and to respective pins of the socket 114. Data terminals D0 to D7 of the storage means 42 are split into two groups D0 to D3 and D4 to D7 and each group is connected to respective inputs of the multiplexers 106 and 108 and thence to corresponding pins of the sockets 32 and 112, in the case of the socket 112, via a resistor array 116. Control lines $\overline{WE}$, $\overline{OE}$ and $\overline{CE}$ togther with address line A8 which carries a transmit/receive status signal, are connected to respective terminals of the storage means 42. The control lines $\overline{WE}$, $\overline{OE}$ and $\overline{CE}$ govern the writing, reading and verifying, respectively, of data stored in the E$^2$PROMs 42 and 70.

By suitable operation of the multiplexers 102, 104, 106, 108 and 110, the channel selector 24 can be operatively coupled to the storage means 42 which provides addresses for locations in the PROM 40 which will occur in normal operation with data transfer unit 34 disconnected from the socket 32. In the case of reprogramming/programming the storage means 42, when the data transfer unit 34 is connected to the socket 32 when the channel selector 24 is inhibited together with the PROM 40. Consequently the storage means 42 can have only one set of addresses presented to it at any time. The operation of the multiplexers 102 to 110 is controlled by a multiplexer control line 118 which is coupled to each of these multiplexers. In effect the multiplexers 102 to 110 function as change-over switches for switching the data lines D0 to D7 and address lines A0 to A7 to the appropriate places under the control of the data transfer unit 34 when plugged-in.

In implementing the invention it was found that care had to be taken to interface properly the data transfer unit 34 and the storage means 42. The fact that the plug 36 (FIG. 1) is connected by approximately one metre of cable to the data transfer unit 34 and that the socket 32 is joined to the control unit 12 by approximately one metre of cable meant that there was risk of stray radiation being picked-up which could corrupt the data stored in the E²PROMs or cause malfunction of the buffers therein. Consequently steps had to be taken both in the control unit 12 and data transfer unit 34 to prevent this occurring. Such steps include decoupling extraneous r.f. inputs to prevent them damaging the integrated circuits.

We claim:

1. A multichannel radio apparatus comprising in combination: a transceiver including a frequency synthesiser and programmable storage means for storing predetermined channel frequency information; a remotely mountable control unit coupled to said transceiver, said control unit including means for selecting any one of a plurality of channels and an electrically alterable storage means, said electrically alterable storage means storing preselected addresses of locations in the programmable storage means which relate to said predetermined plurality of channels, said control unit further including an externally accessible interface adapted to operatively couple said electrically alterable storage means to a data transfer unit for programming or reprogramming the preselected addresses stored in such electrically alterable storage means to thereby change the channel frequency information for said plurality of channels.

2. An apparatus as claimed in claim 1, wherein said programmable storage means comprises a PROM which stores data to be supplied to said frequency synthesiser.

3. An apparatus as claimed in claim 1, wherein said electrically alterable storage means comprises an EAROM.

4. An apparatus as claimed in claim 1, wherein said electrically alterable storage means comprises an E²-PROM.

5. An apparatus as claimed in claim 1, wherein said data transfer unit comprises a non-volatile memory for storing data to be used for programming or reprogramming said electrically alterable storage means.

6. An apparatus as claimed in claim 1, wherein said control unit further includes means for inhibiting the power supply to the transceiver when said electrically alterable storage means is being programmed or reprogrammed by said data transfer unit.

7. An apparatus as claimed in claim 6, wherein said control unit further comprises a power supply and said interface includes a connection to said power supply whereby said data transfer unit derives its power from said power supply when programming or reprogramming the electrically alterable storage means.

8. An apparatus as claimed in claim 1, wherein said externally accessible interface comprises a first part of a two-part connector coupled to said control unit by a flexible lead, a second, complementary part of said two-part connector being coupled to said data transfer unit; and wherein said control unit further comprises means to prevent spurious signals from being produced when the data transfer unit is disconnected from the connector and/or allowing extraneous signals from affecting the normal operation of the control unit.

* * * * *